(12) United States Patent
Ameen et al.

(10) Patent No.: US 6,361,673 B1
(45) Date of Patent: Mar. 26, 2002

(54) ELECTROFORMING CELL

(75) Inventors: Thomas J. Ameen, Mentor; Barbara J. Kidon, Chardon; Peter Peckham, Painesville, all of OH (US)

(73) Assignee: GA-TEK Inc., Eastlake, OH (US)

( * ) Notice: Subject to any disclaimer, the term of this patent is extended or adjusted under 35 U.S.C. 154(b) by 0 days.

(21) Appl. No.: 09/604,630

(22) Filed: Jun. 27, 2000

(51) Int. Cl.[7] .............................. C25D 1/04; C25D 5/10
(52) U.S. Cl. ..................... 205/77; 205/138; 205/141; 205/142; 205/177; 205/178; 205/182; 204/206; 204/208; 204/209
(58) Field of Search ..................... 205/77, 138, 141, 205/142, 177, 178, 182; 204/206, 208, 269

(56) References Cited

U.S. PATENT DOCUMENTS

| | | | |
|---|---|---|---|
| 3,674,656 A | 7/1972 | Yates | 204/13 |
| 3,803,013 A | 4/1974 | Yates | 204/206 |
| 3,901,785 A | 8/1975 | Buzhinskaya et al. | 204/208 |
| 5,215,646 A | 6/1993 | Wolski et al. | 205/77 |
| 5,433,840 A | 7/1995 | Dahms et al. | 205/296 |
| 5,863,410 A | 1/1999 | Yates et al. | 205/585 |
| 5,989,727 A | 11/1999 | Yates et al. | 428/607 |
| 6,270,645 B1 * | 8/2001 | Yates et al. | 205/77 |

* cited by examiner

*Primary Examiner*—Arun S. Phasge
(74) *Attorney, Agent, or Firm*—Mark Kusner; Michael A. Jaffe; Michael A. Centanni (57) ABSTRACT

An apparatus for producing metal foil, comprising a drum cathode having an outer plating surface. The drum cathode is partially immersed to a set level in an electrolyte bath and is rotatable in a fixed direction about a generally horizontal axis. A main anode assembly having a main anode is immersed in the electrolyte bath, the main anode having a semi-cylindrical curved anode surface facing the drum cathode. The main anode is dimensioned to be spaced from the plating surface of the drum cathode so as to define a generally uniform gap therebetween. An energy source is connected to the main anode for energizing the main anode. A chamber containing an electrolyte solution is disposed above the electrolyte bath and adjacent the cathode drum where the cathode drum exits the electrolyte bath. A treatment anode is immersed in the electrolyte solution in the chamber adjacent the drum cathode. An energy source is connected to the treatment anode for energizing the treatment anode.

20 Claims, 5 Drawing Sheets

ELECTROFORMING CELL

FIELD OF THE INVENTION

The present invention relates generally to a process for electrodepositing metal, and more particularly, to an electroforming cell for forming metal foil, the cell having means for applying a surface treatment to the metal foil. The present invention is particularly applicable in forming thin copper foil and will be described with particular reference thereto; it being understood, however, that the present invention may also find advantageous application in electroforming and surface treating other metal foils.

BACKGROUND OF THE INVENTION

The basic technique in forming electrodeposited foil has not changed greatly over the years. In this respect, electrodeposited copper foil is generally formed by immersing a rotating drum cathode in an electrolyte solution containing copper ions. An anode formed from one or more arcuate sections of electrically conductive material is immersed in the electrolyte solution and positioned adjacent the drum cathode. The anode is formed to have a surface generally conforming to the curvature of the drum cathode so as to define a uniform inner electrode gap therebetween. Copper foil is formed on the rotating drum by applying a current, having a current density lower than the limiting current density of the electrolyte solution, to the anode and cathode. The electrodeposited foil is continually removed from the drum cathode as it emerges from the electrolyte solution so as to permit continuous foil production.

Typically, the electrodeposited copper foil formed in accordance with the foregoing process is then surface treated to improve and enhance the surface of the foil for bonding the same to another surface, typically a polymeric substrate. This latter surface treatment process, sometimes called a "bonding treatment" is generally carried out as a separate and distinct process from the electroforming process. In this respect, the electroforming of the base copper foil generally takes place using a concentrated, hot copper sulfate/sulfuric acid electrolyte whereas the surface treatment usually requires a colder, more dilute electrolyte to produce fragile, powdery deposits on the surface of the copper foil.

Attempts have been made to surface treat electroformed copper as part of the electroforming process. See for example, U.S. Pat. No. 3,901,785 to Buzhinskaya et al. and U.S. Pat. No. 5,863,410 to Yates et al., both of which disclose an electroforming cell having a surface treatment anode following a main forming anode for surface treatment copper formed by the main forming anode. The surface treatment anode is immersed within the same electrolyte that is used to form the base copper foil. The cell shown in U.S. Pat. No. 3,901,785 to Buzhinskaya et al. attempts to control the concentration of the electrolyte solution in the vicinity of the surface treatment anode by isolating the surface treatment anode with a barrier element. The cell shown in U.S. Pat. No. 5,863,410 to Yates et al. attempts to control the concentration of the electrolyte in the vicinity of the treatment anode by introducing electrolytes near the surface treatment anode.

In both arrangements because the treatment anode is disposed adjacent the main forming anode in the electrolyte solution. The performance of the treatment anode is therefore affected by the composition (i.e., chemistry) of the electrolyte forced through the inner electrode gap. Further, gas generated during the electroforming process will bubble past the treatment anode further affecting its operation.

The present invention overcomes these problems and provides an electroforming cell having a main anode assembly for forming the base copper foil and a separate treatment anode for applying a surface treatment to the electroformed copper disposed in a separate and distinct electrolyte chamber separate from the main anode assembly, and a method of using the same.

SUMMARY OF THE INVENTION

In accordance with the present invention, there is provided an apparatus for producing metal foil, comprising a drum cathode having an outer plating surface. The drum cathode is partially immersed to a set level in an electrolyte bath and is rotatable in a fixed direction about a generally horizontal axis. A main anode assembly having a main anode is immersed in the electrolyte bath, the main anode having a semicylindrical curved anode surface facing the drum cathode. The main anode is dimensioned to be spaced from the plating surface of the drum cathode so as to define a generally uniform gap therebetween. An energy source is connected to the main anode for energizing the main anode. A chamber containing an electrolyte solution is disposed above the electrolyte bath and adjacent the cathode drum where the cathode drum exits the electrolyte bath. A treatment anode is immersed in the electrolyte solution in the chamber adjacent the drum cathode. An energy source is connected to the treatment anode for energizing the treatment anode.

In accordance with another aspect of the present invention, there is provided an electroforming process for producing copper foil having a surface treatment applied thereto, comprising the steps of rotating a cathode drum about a fixed axis past a primary anode that is dimensioned and positioned relative to the drum to create a uniform gap therebetween. Forcing an electrolyte solution through the gap while passing a direct, plating electric current through the first electrolyte solution from the anode to the cathode to electroform on the cathode drum a base copper foil. Moving the base copper foil on the drum past the primary anode and the electrolyte solution. Moving the base copper foil on the drum past an enclosure having a treatment anode that is dimensioned and positioned relative to the cathode drum to create a uniform space therebetween. Introducing an electrolyte solution into the enclosure and the space at a controlled rate while passing a direct, treating electric current through the electrolyte solution from the treatment anode to the cathode to deposit micronodules of copper.

It is an object of the present invention to provide an electroforming cell for forming a metallic foil wherein the cell includes means for applying a bonding treatment to a surface of the metallic foil.

It is another object of the present invention to provide an electroforming cell as described above wherein the means for applying a bonding treatment utilizes the electroforming solution used to form the metallic foil.

A still further object of the present invention is to provide an electroforming cell as described above having one or more treatment anodes that are isolated from the electrolyte bath and the anodes that form the base copper foil.

A still further object of the present invention is to provide an electroforming cell as described above wherein the flow of an electrolyte solution past the treatment anode(s) is controlled to be sufficiently slow as to deplete copper in the electrolyte solution to deposit micronodules of copper.

These and other objects will become apparent from the following description of a preferred embodiment taken together with the accompanying drawings and the appended claims.

BRIEF DESCRIPTION OF THE DRAWINGS

The invention may take physical form in certain parts and arrangement of parts, a preferred embodiment of which will be described in detail in the specification and illustrated in the accompanying drawings which form a part hereof, and wherein.

DETAILED DESCRIPTION OF PREFERRED EMBODIMENT

Figure 1:
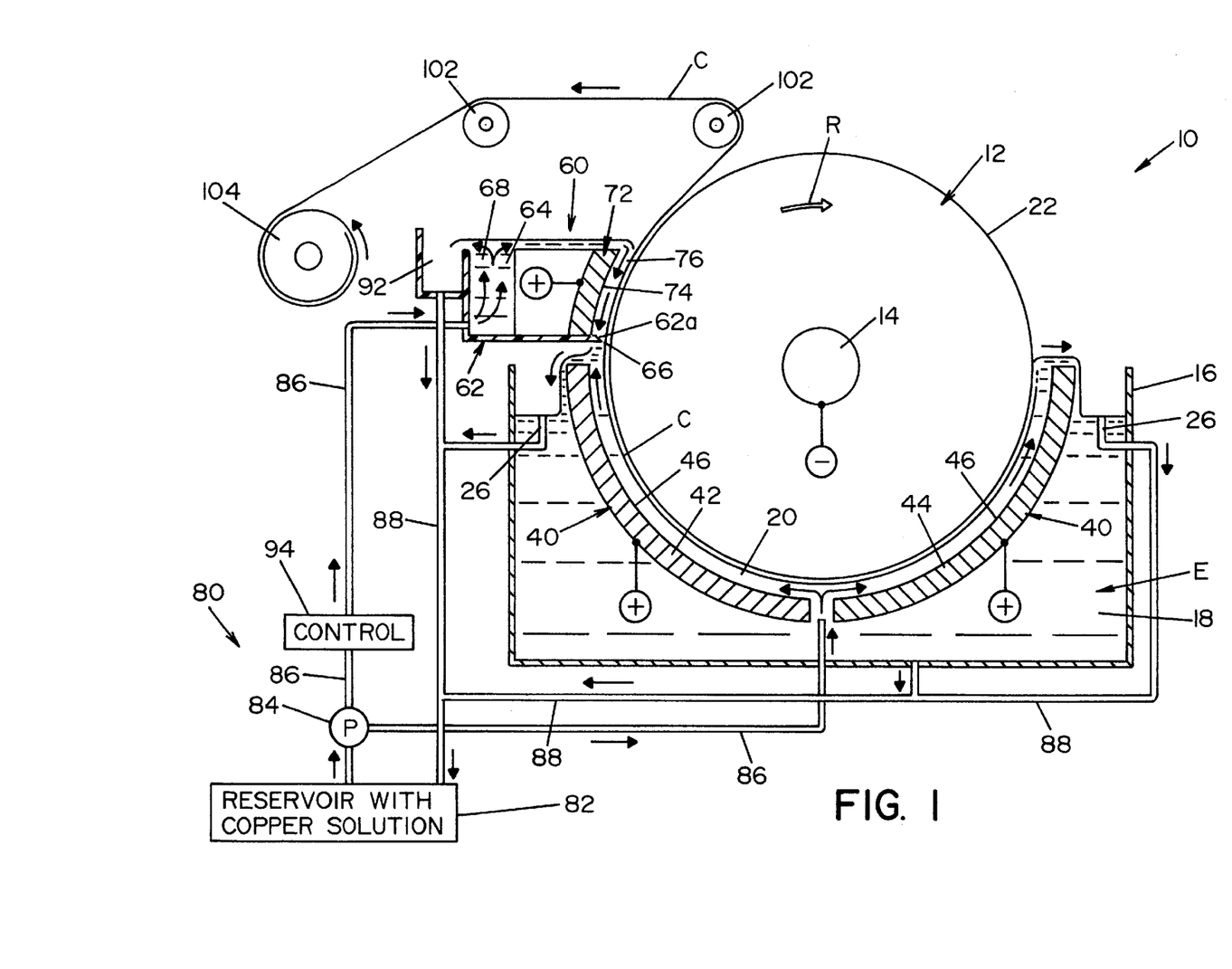
FIG. 1 is a partially sectioned, side elevational view of an electroforming cell having a surface treatment apparatus, illustrating a preferred embodiment of the present invention.

Referring now to the drawings wherein the showings are for the purpose of illustrating a preferred embodiment of the invention only, and not for the purpose of limiting same, FIG. 1 shows an electroforming cell 10 for electroforming metal foil, illustrating a preferred embodiment of the present invention. The present invention is particularly applicable for forming copper foil, and will be described with reference thereto, although it will be appreciated from a further reading of the present disclosure that the present invention finds advantageous application in forming other metal foils. Broadly stated, electroforming cell 10 is generally comprised of a drum cathode 12, a main anode assembly 40, a treatment anode assembly 60 and an electrolyte re-circulation system 80.

Drum cathode 12 is generally cylindrical in shape and is mounted on a shaft 14. Drum cathode 12 may be formed of any suitable electrically conductive metal or metal alloy, including lead, stainless steel, columbium, tantalum, titanium, or an alloy thereof, and has a polished plating surface, designated 22. Plating surface 22 may be formed from titanium, columbium, tantalum, chromium or an alloy thereof.

According to the present invention, drum cathode 12 is preferably comprised of stainless steel and has a plating surface 22 formed of chromium. In the embodiment shown, drum cathode 12 is disposed within tank 16. Tank 16 is adapted to contain an electrolyte solution, designated "E," that defines an electrolyte bath 18. Shaft 14 is mounted relative to tank 16 wherein a portion of drum cathode 12 is immersed in electrolyte bath 18, as illustrated in FIG. 1. Shaft 14 is mounted by conventional means (not shown) for rotation about a generally horizontal axis. Drum cathode 12 may be rotated by any suitable drive motor arrangement (not shown) as is conventionally known in the art. Drum cathode 12 is preferably rotated in a fixed direction, designated by the arrow "R," at a circumferential speed that permits plating surface 22 to remain in contact with electrolyte bath 18 for a sufficient period of time to develop a desired foil thickness, in a manner as shall be described in greater detail below.

In the embodiment shown in FIG. 1, main anode assembly 40 is comprised of a left anode section 42 and a right anode section 44. Anode sections 42, 44 are basically arcuate plates and each has an arcuate anode surface 46 facing drum cathode 12. Anode sections 42, 44 are dimensioned and disposed relative to drum cathode 12 to define a generally uniform inner electrode gap 20 between anode surfaces 46 of anode sections 42, 44 and drum cathode 12. Anode sections 42, 44 may be formed of any electrically conductive material that is inert to electrolyte solution E. Anode sections 42, 44 are preferably formed from lead, titanium, tantalum, platinum, or a composite structure comprised of a copper core clad with one of the foregoing materials.

Figure 2:
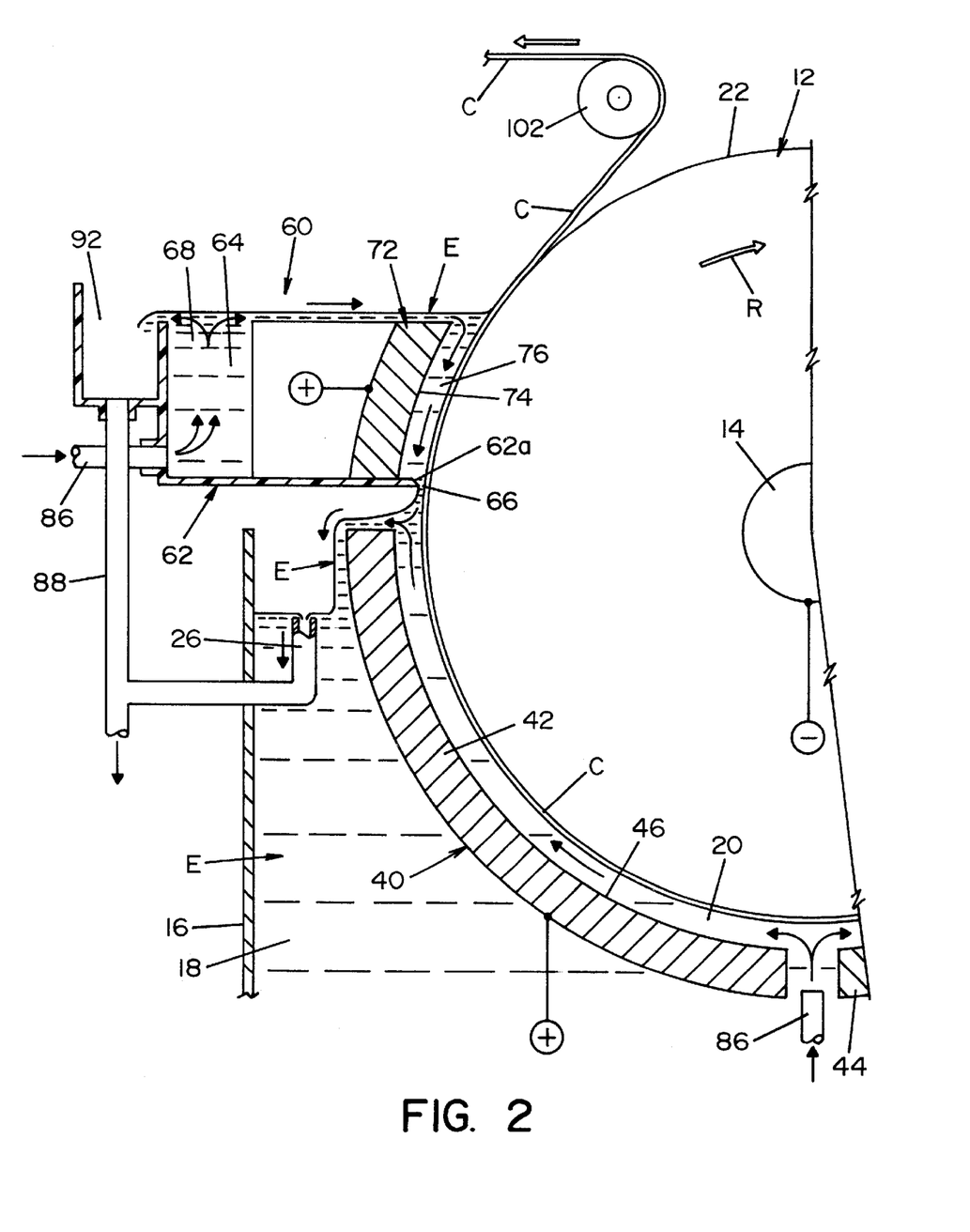
FIG. 2 is an enlarged sectional view of the surface treatment apparatus shown in FIG. 1.

Referring now to treatment anode assembly 60, an enclosure 62 is disposed above tank 16 and electrolyte bath 18. Enclosure 62 is located where drum cathode 12 exits tank 16. Enclosure 62 has edges, designated 62a, that are dimensioned to mate with the contours of plating surface 22 of drum cathode 12 to basically define an enclosed tank having a chamber 64. In the embodiment shown, enclosure 62 is dimensioned such that a slight gap 66 exists between edges 62a of enclosure 62 and plating surface 22 of drum cathode 12, as best seen in FIG. 2. Gap 66 allows drum cathode 12 (with electroplated copper thereon) to rotate past enclosure 62 without an interference or contact with enclosure edges 62a.

Enclosure 62 is dimensioned to hold electrolyte solution E so as to define a second electrolyte bath 68. In this respect, gap 66 between edges 62a of enclosure 62 and plating surface 22 of drum cathode 12 allows electrolyte E to flow from chamber 64 at a predetermined rate so as to allow copper depletion, as shall be described in greater detail below. A treatment anode 72 is disposed within chamber 64. Treatment anode 72 is an arcuate plate having an arcuate anode surface 74 facing drum cathode 12. Treatment anode 72 may be formed of any electrically conducted material that is inert to the electrolyte solution. Treatment anode 72 is preferably formed from lead, titanium, tantalum, platinum or a composite structure comprised of a copper core clad with one of the foregoing materials. Treatment anode 72 is spaced from drum cathode 12 to define a generally uniform inner electrode gap 76.

During an electrodeposition process, metal ions in the electrolyte solution are depleted. A re-circulating system 80 is provided to replenish the depleted metal ions. Re-circulation system 80 includes a reservoir 82, schematically illustrated in FIG. 1. Replenishing metal ions in an electrolyte from a reservoir system is conventionally known. Replenished (i.e., fresh) electrolyte E from reservoir 82 is conveyed to electrolyte baths 18 and 68 by a pump 84 through feed conduit pipes 86.

Electrolyte solution E is continuously forced into gap 20 by conduit 86, as is conventionally known in the art and as schematically illustrated in FIG. 1. The continuous circulation of electrolyte solution E through inner electrode gap 20 produces a flow of electrolyte solution E from the bottom of drum cathode 12 through inner electrode gap 20 up toward the upper ends of anode sections 42, 44. Overflow pipes 26 are provided within tank 16 to collect electrolyte E and return it to reservoir 82 through return conduits 88. In the embodiment shown, overflow pipes 26 are below the upper end of anode sections 42, 44. As will be appreciated by those skilled in the art, since electrolyte E is forced through inner electrode gap 20, electrolyte will flow over the upper end of anode sections 42, 44 even if the overflow pipes are lower than the upper edges of anodes 42, 44.

An overflow trough 92 is provided along the upper edge(s) of enclosure 62 to collect electrolyte E overflowing chamber 64. Overflow electrolyte E is returned to reservoir 82 by return conduit 88. As best seen in FIG. 2, treatment anode assembly 60 is designed such that only a portion of the electrolyte E that is introduced into chamber 64 flows through gap 76. In this respect, a portion of the electrolyte introduced into chamber 64 flows across the top of anode 72 into gap 76 as schematically illustrated in FIG. 2. The rate of flow of the electrolyte through gap 76 is basically controlled by the width of gap 66 between edges 62a of enclosure 62 and plating surface 22 of drum cathode 12 (and any copper foil thereon). In accordance with one aspect of the present invention, the width of gap 66 is established to create a flow of electrolyte E past treatment anode 72 wherein copper ions are depleted so as to produce micronodules of copper on the base copper foil moving past treatment anode 72. In this respect, the dimensions of gap 66, as well as the electrolyte flow into chamber 64, effect the level of copper ions in gap 76. As shown in FIG. 1, a control device 94 for regulating the flow of electrolyte E to treatment anode assembly 60 is provided in feed line 86. Control device 94 is operable to regulate the flow of electrolyte E to chamber 64.

Anodes 42, 42 and treatment anode 72 are positively charged by an electrical power source(s) as schematically illustrated in FIGS. 1 and 2. Drum cathode 12 is negatively charged.

Referring now to the operation of the electroforming cell 10, drum cathode 12 is rotated in a counter-clockwise direction as indicated by arrow R in the drawings. Recirculating system 80 forces electrolyte E into tank 16 and enclosure 62. More specifically, electrolyte E is forced by pump 84 through gap 20 past anode surfaces 46 of anodes 42, 44 in electrolyte bath 18, and into enclosure 62 behind treatment anode 72. The flow of electrolyte E to main forming anodes 42, 44 is unrestricted to provide replenished (i.e., fresh) electrolyte E to anodes 42, 44 to form the base copper C. In accordance with the present invention, the flow of electrolyte E into enclosure 62 is preferably controlled by control device 94 to produce a reduced flow. In this respect, the flow of electrolyte E to enclosure 62 is controlled such that the flow of electrolyte E past anode surface 74 of treatment anode 72 is sufficiently slow so as to deplete the level of copper ions in gap 76 to facilitate the formation of micronodules on copper C. As described above, the flow of electrolyte E past anode surface 74 of treatment anode 72 is determined in part by the flow of electrolyte E to enclosure 62, in part by the dimensions of gap 66 and in part by the amount of electrolyte E that overflows into overflow trough 92.

A direct electric current is passed through the electrolyte solution E from anodes 42, 44 to drum cathode 12 to electroform copper on plating surface 22 of drum cathode 12. A direct current is also passed through the electrolyte E in electrolyte bath 68 from treatment anode 72 to drum cathode 12. The level of current applied to treatment anode 72 may be the same or different from that applied to anodes 42, 44.

Figure 3:
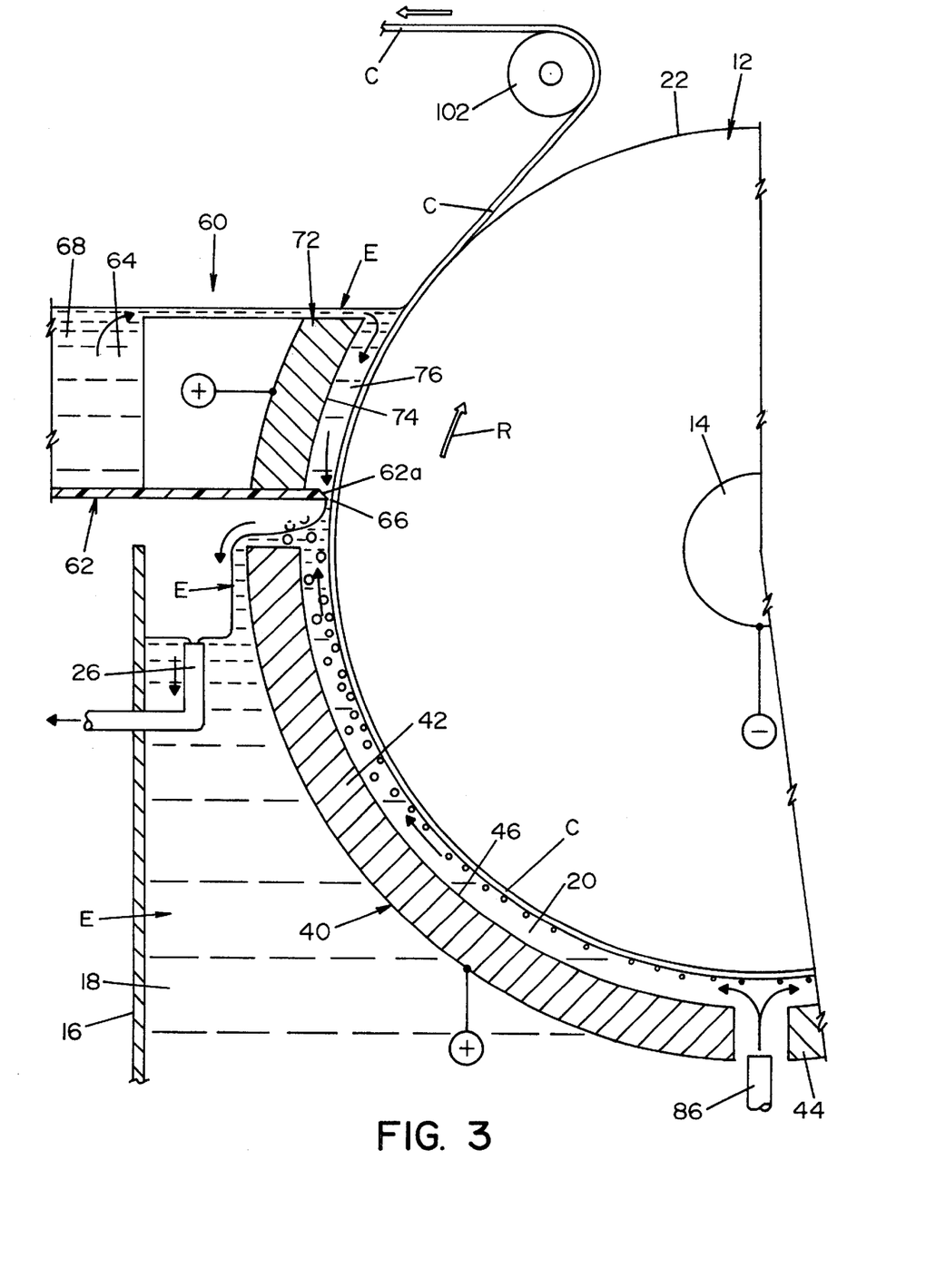
FIG. 3 is an enlarged sectional view of a main forming anode and a surface treatment anode illustrating the direction of flow of electrolyte and the formation of gas bubbles in the gap between the main anode and surface of the drum.

In the embodiment shown, copper begins to plate onto plating surface 22 as drum cathode 12 enters electrolyte E at the upper end of anode 44. As plating surface 22 of drum cathode 12 continues to rotate past anode 44, and then anode 42, copper continues to build up until a base copper foil is formed on plating surface 22. As illustrated in FIG. 2, hydrogen gas is generated with an inner electrode gap 20 during the electroplating process. Bubbles of hydrogen gas move upward through the inner electrode gap 20 as a result of their natural tendency to rise to the surface of the fluid, as well as under the influence of forced electrolyte flowing through gap 20, as illustrated in FIG. 3. The continuous flow of electrolyte E through gap 20 replenishes the metallic ions in electrolyte E. Electrolyte that overflows anodes 42, 44 is collected by overflow pipes 26 and returned to reservoir 82 to be replenished and pumped back into inner electrode gap 20.

Eventually, the copper on plating surface 22 moves past anode 42 and passes treatment anode 72 in chamber 64. In accordance with the present invention, the configuration of treatment anode 72 and enclosure 62 are such that the flow of electrolyte E past anode surface 74 is very slow. In this respect, preferably, only a small amount of electrolyte E is allowed to escape chamber 64 through gap 66. As schematically illustrated, only a portion of electrolyte E forced into chamber 64 flows into gap 76 between anode surface 74 and the copper on plating surface 22. Because of the relatively slow flow of electrolyte E through inner electrode gap 76, copper ions in electrolyte E are depleted thereby producing nodular plating onto the surface of the base copper foil. Electrolyte E flowing from enclosure 62 through gap 66 merges with electrolyte E in bath 18 and is collected therewith to be returned to reservoir 82. Excess electrolyte forced into chamber 64 is likewise collected by trough(s) 92 and returned to reservoir 82 for replenishment and re-circulation to electrolyte baths 18 and 68.

Copper foil, designated "C" in the drawings, having nodular surface treatment on one side thereof passes around guide rollers 102 and is wound onto a take-up roll 104.

The invention shall further be described by the following example of an electroforming cell 10.

EXAMPLE

Base copper foil is formed using an electrolyte E having the following chemistries:

| | |
|---|---|
| Copper: | 60 g/l |
| Acid: | 100 g/l |
| Chloride: | less than 3 ppm |
| Temperature: | approximately 140° F. |
| Current Density: | 500 ASF |

The base copper foil is rotated past treatment anode 72. The electrolyte used with the treatment anode has the following chemistries:

| | |
|---|---|
| Copper: | 60 g/l |
| Acid: | 100 g/l |
| Chloride: | less than 3 ppm |
| Temperature: | approximately 140° F. |
| Current Density: | 500 ASF |

The flow of electrolyte E past anode surface 74 of treatment anode 72 is controlled wherein electrolyte E in gap 76 is sufficiently slow so as to deplete the copper ions in gap 76 to facilitate the formation of micronodules.

The present invention thus provides an apparatus and method of forming a copper foil with surface treatment thereon in a single electroforming cell. The ability to surface treat a base copper foil on the foil forming drum include the ability to use relatively high current density since current flows through the drum and not along a foil sheet as would be required in subsequent treating lines. Further, a separate treatment anode assembly enables the current density established on the treatment anode to be separate and distinct from the main forming anodes. In this respect, flow of electrolyte E to gap 76 may be controlled by controlling the flow of electrolyte into enclosure 62. Still further, the current applied to treatment anode 72 may also be controlled separate and distinct from main anodes 42, 44. A still further advantage of the separate treatment anode assembly is that turbulence created by the high flow of electrolyte through gap 20 as well as the gas bubbles formed during the formation of the base copper does not influence or affect the operation of treatment anode 72.

Figure 4:
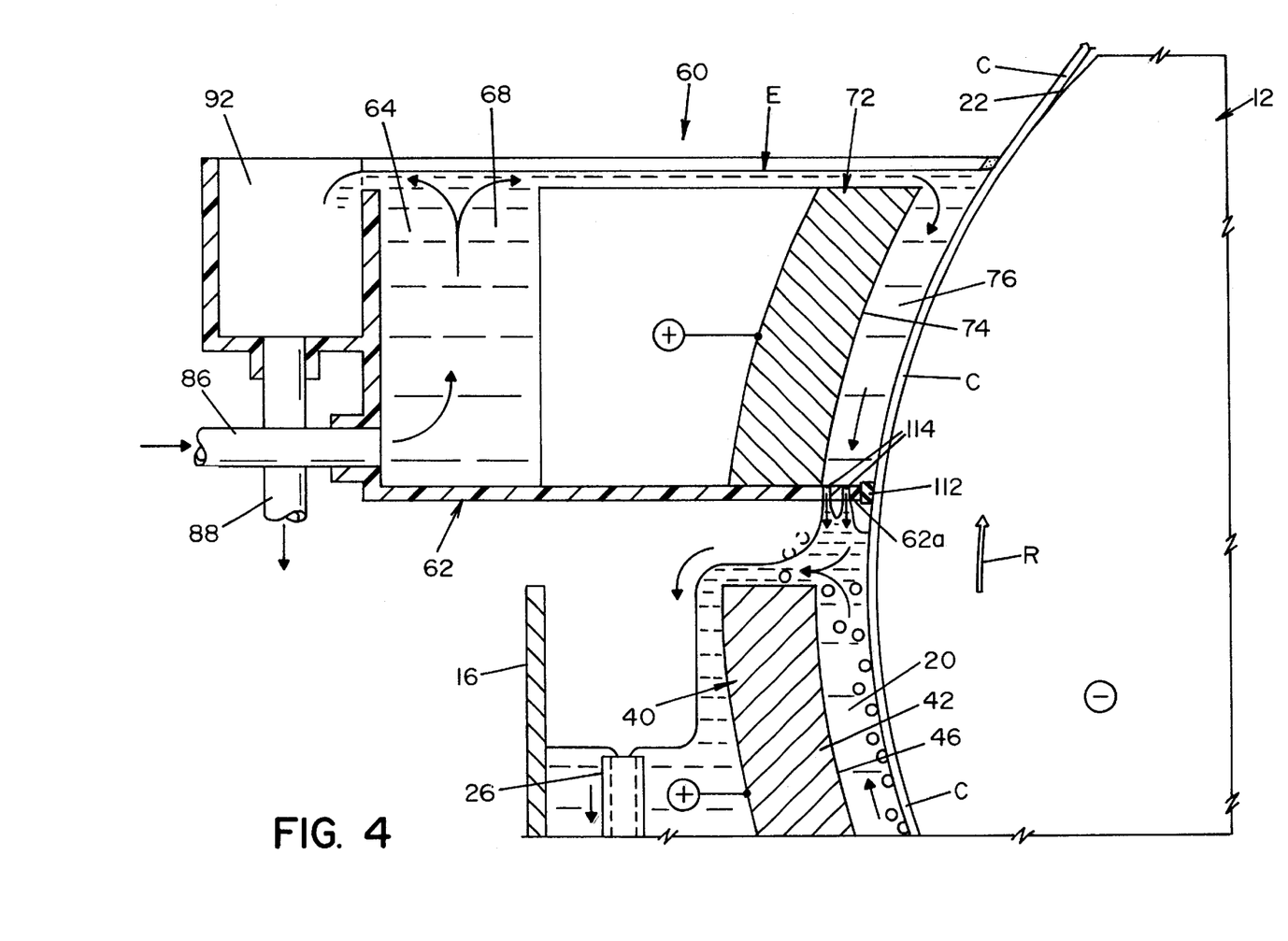
FIG. 4 is an enlarged view of a surface treatment apparatus for an electroforming cell having an enclosure sealed against the drum cathode wherein the flow of electrolyte past a surface treatment anode is established by apertures in the bottom of the enclosure, illustrating an alternate embodiment of the present invention.
Figure 5:
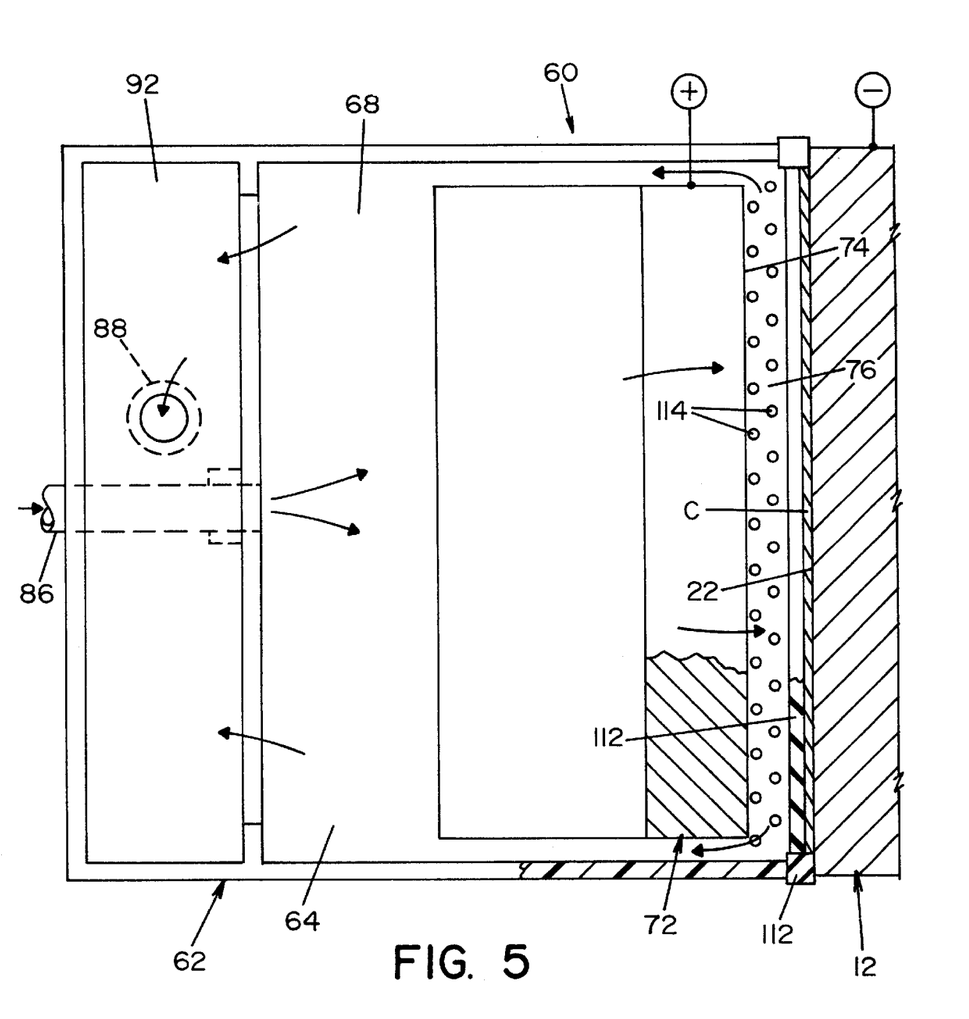
FIG. 5 is a partially, sectioned plan view of the surface treatment apparatus shown in FIG. 4.

In the embodiment shown in FIGS. 1–3, flow of electrolyte E though gap 76 of treatment anode assembly 60 is basically established by gap 66 that is defined between edges 62a of enclosure 62 and drum 12 with copper C thereon. FIGS. 4 and 5 show an alternate embodiment of the present invention wherein edge 62a of enclosure 62 is sealed against copper C on drum 12 by a resilient, elastomeric element 112, that is schematically shown in FIGS. 4 and 5. Element 112 basically engages the base copper foil C that is electrodeposited onto surface 22 of drum 12 and operatively forms a fluid-type seal therewith. In the embodiment shown, a plurality of apertures 114 are formed in the bottom of enclosure 62 below gap 76 to allow electrolyte E to flow from chamber 66. The dimension of apertures 114 establishes the amount of electrolyte E that is allowed to flow through gap 76 and escape enclosure 62. With the embodiment shown in FIGS. 4 and 5, the flow of electrolyte E through gap 76 can be more closely controlled. In this respect, plugs (not shown) may be used to close a select number of apertures 114 to allow less electrolyte E to flow from enclosure 62 therethrough. Such an arrangement provides another method of controlling the flow of electrolyte through gap 76 so as to obtain the desired ion concentration in electrolyte E during the operation of treatment anode 72.

The foregoing description is a specific embodiment of the present invention. It should be appreciated that this embodiment is described for purposes of illustration only, and that numerous alterations and modifications may be practiced by those skilled in the art without departing from the spirit and scope of the invention. It is intended that all such modifications and alterations be included insofar as they come within the scope of the invention as claimed or the equivalents thereof.

Having described the invention, the following is claimed:

1. An apparatus for producing metal foil, comprising:
   a drum cathode having an outer plating surface, said drum cathode being partially immersed to a set level in an electrolyte bath and being rotatable in a fixed direction about a generally horizontal axis;
   a main anode assembly having a main anode immersed in said electrolyte bath, said main anode having a semi-cylindrical curved anode surface facing said drum cathode, said main anode being dimensioned to be spaced from said plating surface of said drum cathode so as to define a generally uniform gap therebetween;
   an energy source connected to said main anode for energizing said main anode;
   a chamber containing an electrolyte solution disposed above said electrolyte bath and adjacent said cathode drum where said cathode drum exits said electrolyte bath;
   a treatment anode immersed in said electrolyte solution in said chamber adjacent said drum cathode; and
   an energy source connected to said treatment anode for energizing said treatment anode.

2. An apparatus as defined in claim 1, wherein said chamber is defined by an enclosure disposed adjacent said drum cathode and above said electrolyte bath, said enclosure having edges shaped to conform to the radius of curvature of said drum cathode.

3. An apparatus as defined in claim 2, wherein a generally uniform gap is defined between said treatment anode and said drum cathode.

4. An apparatus as defined in claim 3, wherein a flow of electrolyte is established in said gap between said treatment anode and said drum cathode, said flow of electrolyte established by an opening defined by said enclosure.

5. An apparatus as defined in claim 4, wherein said opening is defined between said enclosure and said drum cathode.

6. An apparatus as defined in claim 4, wherein said opening is formed through a wall of said enclosure.

7. An apparatus as defined in claim 4, further comprising:
   a tank for replenishing metallic ions depleted during an electrodeposition process; and
   an electrolyte circulation system for re-circulating electrolyte between said replenishment tank and said electrolyte bath and said chamber.

8. An apparatus as defined in claim 7, wherein said circulation system includes means for varying the flow of electrolyte to said chamber.

9. An apparatus as defined in claim 4, wherein said energy source connected to said main anode produces a first current density.

10. An apparatus as defined in claim 9, wherein said energy source connected to said treatment anode produces a second current density different from said first current density.

11. An apparatus as defined in claim 4, wherein said flow of electrolyte through said gap between said drum cathode and said treatment anode is controlled to reduce the concentration of metal ions in said gap.

12. An electroforming process for producing copper foil having a surface treatment applied thereto, comprising the steps of:
   rotating a cathode drum about a fixed axis past a primary anode that is dimensioned and positioned relative to said drum to create a uniform gap therebetween;
   forcing an electrolyte solution through said gap while passing a direct, plating electric current through said first electrolyte solution from said anode to said cathode to electroform on said cathode drum a base copper foil;
   moving said base copper foil on said drum past said primary anode and said electrolyte solution;
   moving said base copper foil on said drum past an enclosure having a treatment anode that is dimensioned and positioned relative to said cathode drum to create a uniform space therebetween;
   introducing said electrolyte solution into said enclosure and said space at a controlled rate while passing a direct, treating electric current through said electrolyte solution from said treatment anode to said cathode, said electrolyte solution introduced into said space at a rate that is sufficiently slow to cause copper depletion in said space to deposit micronodules of copper on said base copper.

13. An electroforming process as defined in claim 12, wherein said electric current through said treatment anode is different from said electric current through said main anode.

14. An electroforming process as defined in claim 12, wherein the flow of electrolyte through said space is less than the flow through said gap.

15. An electroforming process as defined in claim 14, wherein the rate of flow through said space is controlled by an opening defined by said enclosure.

16. An electroforming process as defined in claim 15, wherein said opening is defined between said enclosure and said drum cathode.

17. An electroforming process as defined in claim 16, wherein said electrolyte solution has a copper concentration of at least 60 g/l.

18. An electroforming process as defined in claim 17, wherein said electrolyte solution has a copper concentration of at least 100 g/l.

19. An electroforming process as defined in claim 17, wherein the temperature of said electrolyte solution is less than or equal to about 140° F.

20. An electroforming process as defined in claim 19, wherein the temperature of said electrolyte solution is about 140° F.

* * * * *

UNITED STATES PATENT AND TRADEMARK OFFICE
CERTIFICATE OF CORRECTION

PATENT NO. : 6,361,673 B1  
DATED : March 26, 2000  
INVENTOR(S) : Thomas J. Ameen et al.

It is certified that error appears in the above-identified patent and that said Letters Patent is hereby corrected as shown below:

Column 5,  
Line 28, delete "counter-clockwise" and insert -- clockwise --.  
Line 61, "FIG. 2" should read -- FIG. 3--3 --.

Signed and Sealed this

Third Day of September, 2002

Attest:

Attesting Officer

JAMES E. ROGAN  
Director of the United States Patent and Trademark Office